United States Patent [19]
Faulk

[11] Patent Number: 5,917,305
[45] Date of Patent: Jun. 29, 1999

[54] BATTERY CONTROL ARCHITECTURE WITH STANDARDIZED LANGUAGE

[75] Inventor: Richard A. Faulk, Cypress, Tex.

[73] Assignee: Compaq Computer Corporation, Houston, Tex.

[21] Appl. No.: 08/989,086

[22] Filed: Dec. 11, 1997

[51] Int. Cl.$^6$ .......................... H01M 10/44; H01M 10/46
[52] U.S. Cl. .............................................................. 320/106
[58] Field of Search ...................................... 320/106, 124, 320/132, 135, FOR 104, FOR 111, FOR 118, FOR 121, FOR 130, FOR 142, FOR 147

[56] References Cited

U.S. PATENT DOCUMENTS

| | | |
|---|---|---|
| 5,534,765 | 7/1996 | Kreisinger et al. ...................... 320/106 |
| 5,629,604 | 5/1997 | Sengupta et al. . | 
| 5,734,254 | 3/1998 | Stephens . |

OTHER PUBLICATIONS

"The L6901 Smart Battery Charger IC" product announcement, SGS–Thomson Microelectronic, Inc. No Date.
"One Chip Solution for Smart Battery Charger, The U24XX", product announcement, TEMIC. No Date.
"DS2435 Battery ID Chip", data sheet, Dallas Semiconductor, 1995.

*Primary Examiner*—Edward H. Tso
*Attorney, Agent, or Firm*—Robert Groover

[57] ABSTRACT

A standardized and universal application-specific language for operation of any battery type where measured values of voltage, current, temperature, and/or power are used to control battery operation to optimize battery life, and prevent damage to the battery and the system in which it resides.

34 Claims, 4 Drawing Sheets

BATTERY CONTROL ARCHITECTURE WITH STANDARDIZED LANGUAGE

BACKGROUND AND SUMMARY OF THE INVENTION

The present invention relates to a battery control architecture with a standardized language.

Background: Battery Chemistries and Characteristics

A vast amount of work has been invested in exploring charge and discharge curves for various battery chemistries and technologies. The very complex electrochemistry of battery cells may cause the optimal relationships of voltage to current and temperature to vary unpredictably when the electrochemical cell structure of a battery is changed. Thus extraction of the maximum possible energy from a battery has always required that charge and discharge be optimized for the particular battery technology being used.

However, this optimization slows down the product cycle. It is not sufficient to develop new electrochemical or structural innovations, but in addition optimal programming must be developed to allow the battery microcontroller to fully exploit each new cell technology.

Even within a single technology (such as lithium-ion), the differences in optimal profiles are great enough such that no simple table look-up operation can give a complete template for accommodating new charge and discharge profiles.

A further complication is that optimization of charge-discharge curves must take account of safety considerations. In particular, battery technologies (such as lithium-ion) which use lithium-based chemistries use a very energetic underlying chemistry, and in such technologies charge-discharge curves are made conservative enough to strictly avoid runaway chemical reactions. Moreover, various cell vendors or manufacturers may have different approaches and requirements to satisfy this safety issue. Thus charge-discharge optimization is not only driven by engineering issues, but also may have additional variations introduced by corporate safety concerns. Thus a framework for a battery charge-discharge specification must be versatile enough to allow for any changes which may be dictated by safety concerns or safety practices, as well as battery architecture, battery chemistry, trade-offs between minimum charge time and optimum charge profile, and changes made during the battery production cycle.

Background: Battery Control Architectures

A great variety of battery control circuits and algorithms have been proposed, from vendors such as Dallas Semiconductor, Maxim, benchmark, and others. Different battery chemistries, cell designs, and charging algorithms are constantly being developed, and therefore continuing improvements are necessary in battery optimization processes. Such architectures may be designed into a portable computer, stand-alone battery charger, or any system utilizing batteries.

Problems with present battery control algorithms are numerous. Many manufacturers are attempting to address the problems associated with extending the life of batteries used in portable computers. As a result, proprietary control algorithms are being developed which add to the cost and complexity of existing and future systems. Furthermore, the algorithms are not easily adaptable, if at all, with competing vendor products.

Another disadvantage with current algorithms is the complexity involved in adapting the algorithm to accept new battery technologies. A skilled technician may be required to rewrite the very complex low-level CPU/microcontroller assembly language to integrate the new battery technology into the system.

Another disadvantage is that existing control mechanisms are hardware and microprocessor specific, requiring that unique algorithms be written for each type of hardware in which a given battery cell is used.

Battery Control Architecture With Standardized Language

The present application discloses a universal battery control architecture which uses a standardized battery control language ("BCL") to define the desired monitor and control charge/discharge control characteristics of any new battery, in any technology.

A major advantage of the battery language is that it can be made compatible with any battery architecture. The language is easily translatable into a wide variety of assembly languages common to many controllers used in battery control designs. Thus the battery controller does not have to "know" at all when a change of technology occurs; it simply carries out the program given to it, and such a program can cover a wide variety of portable batteries. A particularly advantageous application of this is described in copending U.S. patent application Ser. No. 08/921,306, which hereby incorporated by reference.

Another advantage is that the language is transportable between different microcontrollers and CPUs.

Another advantage of the BCL is that it is more intuitive—it is a higher-level language and thus more easily understood by one who has had no prior experience with the language.

Another advantage is that the language easily permits designers to optimize battery life by controlling the charge/discharge characteristics.

Another advantage is that the language, prevents damage to the battery and the system into which it is used by allowing alarm limits to be set on critical parameters associated with the particular battery technology employed. Temperature is a critical parameter used in judging the charging status. If, for example, the battery reaches a critical temperature, the system is programmed to trigger alarms which initiate an orderly shutdown to maintain the integrity of the battery and system. The temperature may also exceed a setpoint which initiates a radical shutdown ("doomsday") procedure to prevent excessive damage to the battery, system, and potentially the user, as is possible when using particular battery chemistries.

Another advantage of the universal language, is the capability of incorporating specifications on a wide variety of battery technologies. Another advantage of the universal language, is the simplicity offered with using a new battery technology. The decision is not left to the user as to whether the battery is appropriate for the particular system. The user doesn't need to consult manuals or vendor support for guidance as to whether the battery is compatible with the system.

Another advantage of the universal language is that the program may be run from the system side or the battery side.

Another advantage is that by virtue of transportability and the ease with which a user may implement changes in the language, the requirement for periodic software maintenance is greatly reduced.

Another advantage of the universal language is the simplicity with which the BCL program can be updated (at the desk or in the field) for use with a new technology battery. It is conceivable that the control program may be embodied on either the system side or the battery module side. In either scenario, updating the BCL program is very simple. If, for example, the program is stored in nonvolatile memory, the program may be updated by using a diskette which contains the update information. If using flash memory, the user may flash the memory with the updated information supplied on a diskette. Other forms of media compatible with the system may be used to input the update information. Alternatively, the user may be prompted by the system for the particular battery parameters for input into the program language. These new parameters may be supplied with each battery module when received from the vendor. These convenient methods for updating the universal language provide a more cost effective alternative then current architectures where proprietary designs require the user to employ technical support when new battery architectures are implemented.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

As battery technology evolves, the process for using the new battery technologies needs to be relatively simple for more or less all entities involved in the production of the product, from the circuit designer, firmware developer, system designer, and ultimately, the end-user. The present application provides a new way to rapidly adapt a controller to optimal or near-optimal operation of various battery cell technologies. This is accomplished by using procedures which not only include programmed operations, but also include state transition operations.

Figure 8:
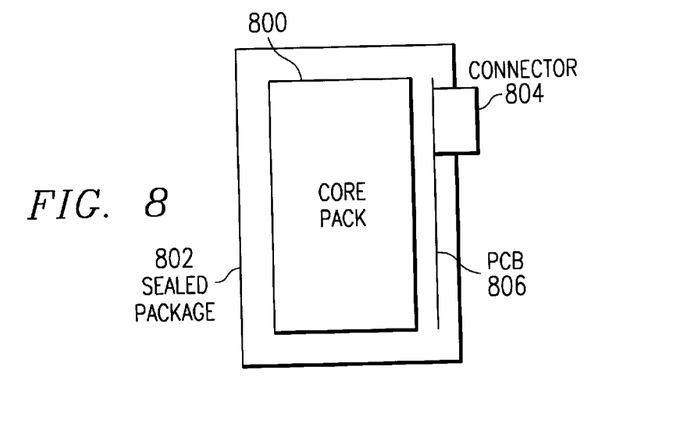
FIG. 8 shows a typical battery module which may employ the innovative battery control language.

FIG. 8 shows a typical battery module which may employ the innovative battery control language. A sealed package 802 comprises the battery core pack 800, an interface connector 804, and a printed circuit board 806 on which all control electronics reside.

Figures 1, 3:
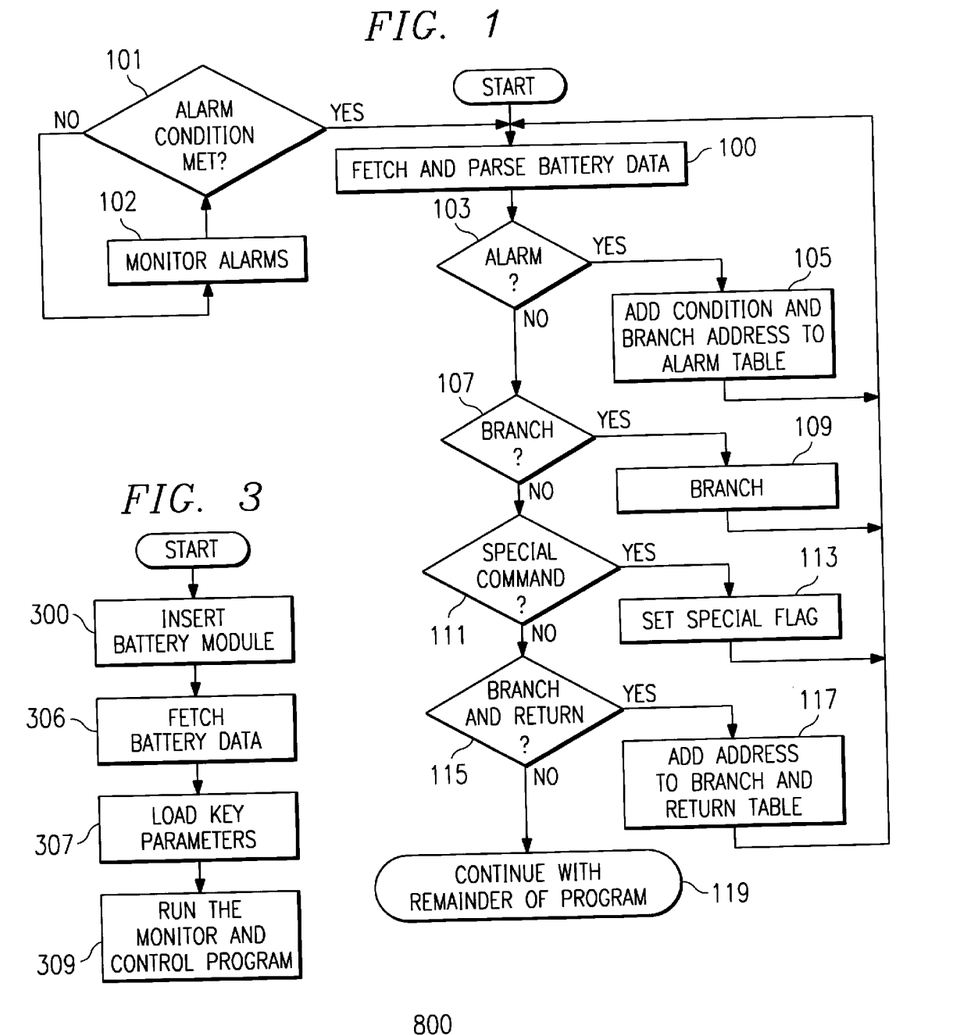
FIG. 1 shows a flowchart of a sample control process using the presently preferred battery control language.
FIG. 3 shows a flowchart of general program execution when inserting a new battery architecture comprising the innovative universal language into a computer system.

FIG. 3 shows a flowchart of general program execution when inserting a new battery architecture comprising the innovative universal language into a computer system. The user inserts the battery (300) into the system and turns on power. The battery data is fetched (306) and the key battery parameters parsed and loaded (307) for use in the monitor and control code (309).

Figure 7:
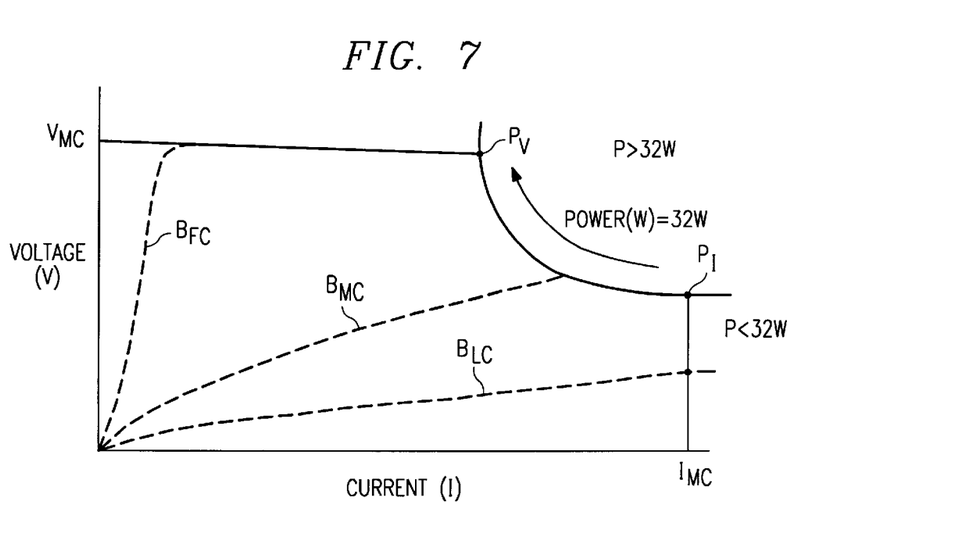
FIG. 7 shows a plot of sample trajectories of voltage/current/power with respect to the charge condition of a battery.

FIG. 7 shows a plot of sample trajectories of voltage/current/power with respect to the charge condition of a battery. The condition of a battery may be of at least three types: at or near fully charged, $B_{FC}$; moderately charged, $B_{MC}$; or low charged, $B_{LC}$. The innovative management program sets limits on maximum charging voltage $V_{MC}$, maximum charging current $I_{MC}$, and power P that the battery receives throughout the charging process. These boundary conditions are determined in dependence upon the various battery chemistries. The charge rate is impacted primarily by the source and load impedances of the battery. In the case where the battery has a low charge $B_{LC}$, the maximum charging current $I_{MC}$ may be exceeded were it not for limits programmed into the control code. Under normal conditions, as the battery charges, it will eventually achieve enough charge to reach the maximum power limit $P_I$ where a constant charging routine clamps the power. The management program controls voltage and current to maintain a constant power input to the battery. Eventually, the battery attains a maximum voltage at a constant power $P_V$, where the charging process is shutdown (or perhaps enters a standby mode). In the instance where a new and fully charged battery module $B_{FC}$ is inserted into the system, in uncontrolled conditions the maximum charging voltage $V_{MC}$ may be exceeded. However, utilizing this innovative language allows the management program to clamp the voltage, as determined by the particular battery chemistry, to prevent battery or system damage.

FIG. 1 shows a flowchart of a sample control process using the presently preferred battery control language. System parameters are continually monitored for alarm conditions (102). For example, if the temperature during charging exceeds 42° C., action will be taken to resolve the problem by performing an orderly shutdown before the radical doomsday shutdown triggers when the battery temperature exceeds 50° C. If an alarm condition exists (101), battery data is fetched from the program and parsed (100) in preparation for an upcoming comparison. If an alarm is triggered (103), the alarm condition and branch address are added to an Alarm Table (105). The program loops back, fetches, and parses the battery data again (100) to determine whether the alarm condition is removed. If the alarm condition is removed (103), program flow continues to determine whether a branching request has been made (107). If so, the branch command (109) is executed, and program flow loops back to the fetch-and-parse code (100). If a branch command has not been requested (107), program flow continues to determine whether a request was made to execute a special command (111) (e.g. shutdown or doomsday). If so, a special flag is set (113) and program flow loops back to the fetch-and-parse code (100). If not, program flow continues to determine whether a request was made to branch and return (115). If so, the branch address is added to a Branch and Return Table (117) and program flow loops back to the fetch-and-parse code (100). If not, program flow continues on to the remaining program code (119).

Figure 5:
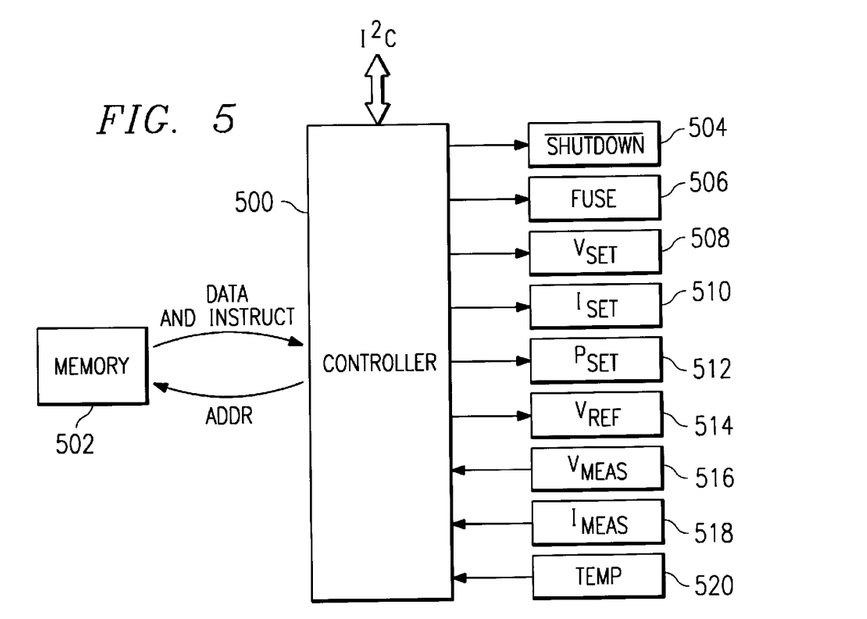
FIG. 5 shows a block diagram of the battery control architecture with BCL monitor and control parameters.

FIG. 5 shows a block diagram of the battery control architecture with BCL monitor and control parameters. A major advantage of the innovative embodiment is that the standardized control language may be independent of the microprocessor language. A controller 500 provides the monitor and control function for the charging system. Communication to the control circuitry 500 is by an $I^2C$ communications bus which provides the mechanism for programming the charging parameters. The memory 502 may store charging parameters in a wide variety of media in contrast to prior-art systems where the parameters were required to be coded into a particular CPU/microprocessor language. For example, the program may be stored in NVRAM, EPROM, flash memory, mass storage media such as a hard disk drive, or even floppy disk media. Data and address information are exchanged between the control circuitry 500 and the memory 502 when the particular battery architecture inserted into the computer is recognized by the system. The data obtained from the memory 502 for the particular battery is used to configure voltage, current, and power setpoints, VSET 508, ISET 510, and PSET 512, respectively. These are analog signals sent to the converter error amplifiers to set the fundamental performance limits and define the charge curve. Additionally, an analog reference voltage VREF 514 is passed through to the charger/converter for regulation. This allows the controller 500 to regulate either total battery voltage or cell voltage. Three values returned to the controller 500 are VMEAS 516, IMEAS 518, and TEMP 520. These values are compared with the setpoints to determine if the charging process is progressing within prescribed limits for the particular battery installed. When charging limits or alarm limits are exceeded, shutdown measures may be taken to prevent damage to the system and/or battery. Shutdown 504 and fuse 506 (doomsday) signals are digital and are used to halt the charging operation. The program can be expanded to handle more complex functions, for example, pulse charging for "gas gauge" functions, and time-related functions—$\Delta V/\Delta t$, $\Delta T/\Delta t$, V/I. A more detailed discussion of additional program variables, command line syntax, alarm, and branch conditions are presented below.

Control Commands—Sets charger limits for Voltage, Current, Power—Standard regulation control functions; V=X, I=Y, and P=Z.

Branch Commands—V, I, P—Points at which change in Table Address takes place.

Alarm—V, I, P—Points at which special, urgent action is required—links commands to many protocols.

Command and Variable Descriptions

Charger Conditions (this establishes the boundary conditions for charging almost all cells):

V=XX.XX—Set voltage limit to value XX.XX

I=YY.YY—Set current limit to value YY.YY

P=ZZ.ZZ—Set power limit to value ZZ.ZZ

Alarm Conditions

AV>XX.XX, YYYY Branch to address YYYY if voltage is greater than XX.XX

AI<XX.XX, YYYY Branch to address YYYY if current is less than XX.XX

AP>XX.XX, YYYY Branch to address YYYY if power is greater than XX.XX

AT>XX.XX, YYYY Branch to address YYYY if temperature is greater than XX.XX

ACLR Clear all alarms

General Comments

The prefix, A, indicates that the parameter is an alarm condition that will be monitored continuously, as shown in the flowchart.

V, I, P, T→Value to monitor voltage, current, power, or temperature.

<, >,=→Less than/greater than, or equal to, with regard to the value for branching.

XX.XX→Alarm value.

YYYY→Address to which the branch is directed.

Branch Conditions $\Delta V/\Delta t$; $\Delta T/\Delta t$; $\Delta I/\Delta t$

BV>XX.XX,YYYY Branch to YYYY if V>XX.XX

BI<XX.XX, YYYY Branch to YYYY if I<XX.XX

BP=XX.XX, YYYY Branch to YYYY if P=XX.XX

BT<XX.XX, YYYY Branch to YYYY if T<XX.XX

Bt>XX.XX, YYYY Branch to YYYY if t>XX.XX (time delay)

B YYYY Unconditional branch

BDT>XX.XX, ttt, YYYY Branch to YYYY, when a deviation in temperature T over time ttt is greater than XX.XX BDI>XX.XX, ttt, YYYY Branch to YYYY, when a deviation in current I over time ttt is greater than XX.XX BDV>XX.XX, ttt, YYYY Branch to YYYY, when a deviation in voltage V over time ttt is greater than XX.XX Special Commands & Flags S1/S0 Set shutdown line high/low: S1—shutdown and alert user.

F1/F0 Set doomsday (fuse condition) line high/low: F1—doomsday enabled and fuse blown.

T1/T0 Temperature line high/low: T0—battery not fully charged; T1—normal termination.

Subroutine

YYYY R Branch and return: If the branch address in any branch command has an "R" suffix—the present address plus one (1) is stored in a return register. A number of "return" addresses may be stored.

RTN Return: Upon encountering a "RTN" command, branch is made to last stored address.

CLR RTN Clear return: clears a return.

Figure 2A:
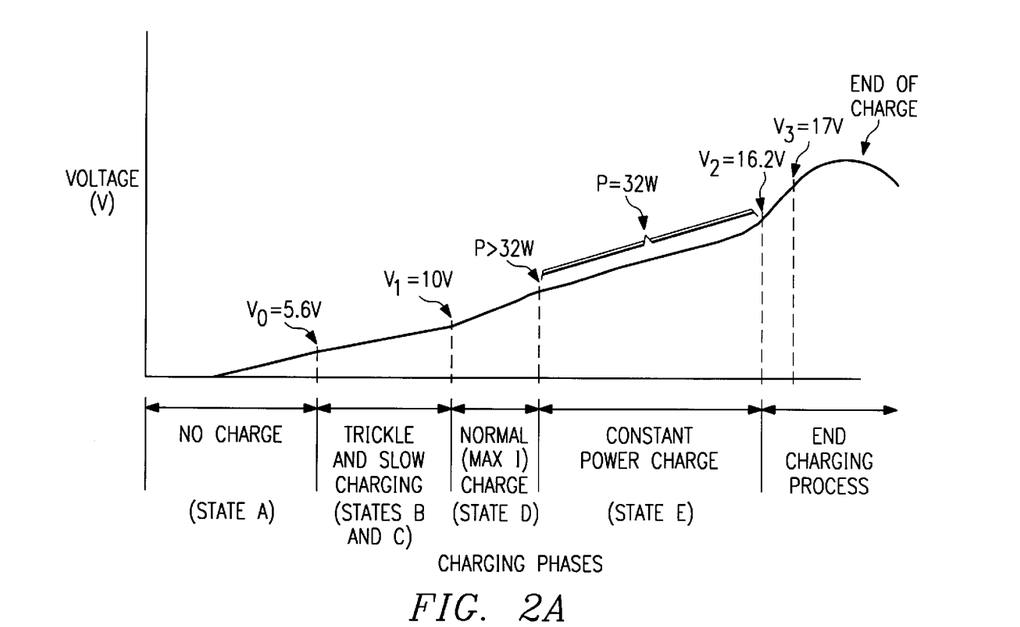
FIG. 2A shows a plot of voltage versus charging phase for a sample NiCd battery.

FIG. 2A shows a typical plot of voltage versus charging phases for a sample NiCd battery. The BCL program disables any charging capability when the voltage $V_0$ is less than 5.6 volts, and is an initial condition which must be met before enabling the charging circuitry (State A). When the voltage exceeds 5.6 V but has not yet attained 10 V, the charging circuit will either produce a trickle charge of 0.15 A (0<T<10° C.) or a slow charge of 0.5 A (10<T<42° C.), depending upon the temperature of the battery cells (States B & C). The trickle charge is employed to avoid gas generation in the battery pack. When the battery voltage exceeds 10 V and the temperature of the battery cells is ideal (10<T<42° C.) for the particular installed battery technology, a maximum charging current of I=2.7 A is provided (State D). The constant power curve of 32 W has not been reached at this time. When the voltage/current relationship is such that the constant power charging setpoint (P=32 W) is attained, the control language manages the current/voltage relationship to maintain a constant power charge of 32 watts (State E). The program executes normal termination of the charging process when either of two conditions exist, 1) the battery voltage has exceeded 16.2 V and the deviation in battery voltage is less than 50 mV in a 10 second period (triggering a shutdown sequence), or 2) the battery voltage has exceeded 17.0 V and the temperature has exceeded 42° C.

Figure 2B:
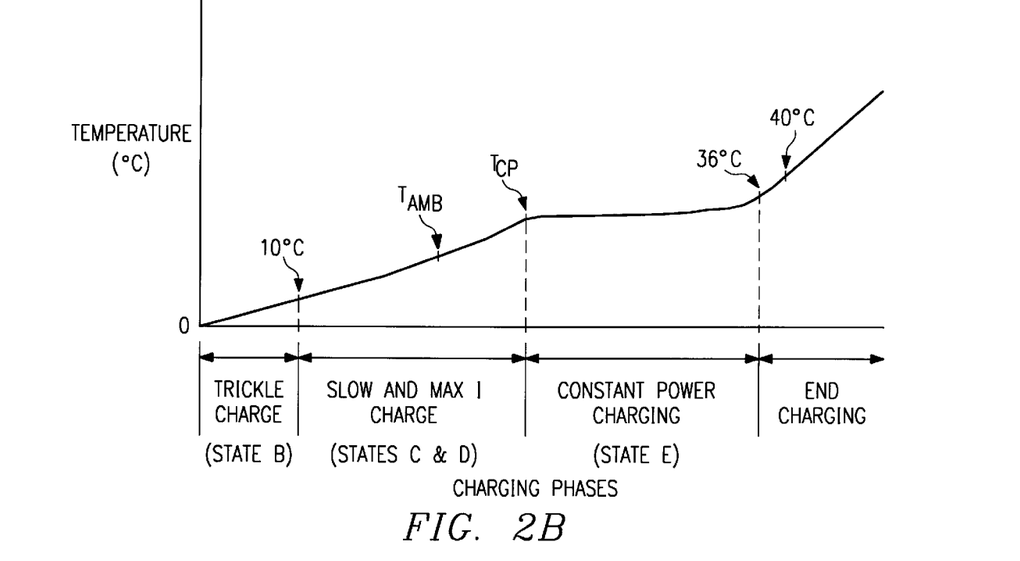
FIG. 2B shows a plot of temperature versus charging phase for a sample NiCd battery.

FIG. 2B shows a typical plot of temperature versus charging phase for a sample NiCd battery. When the temperature is within the range of 0° C.–10° C., a trickle charge current of 0.15 A is provided (State B). Either a slow charge current of 0.5 A, or a maximum charging current of 2.7 A are provided (depending on V) when the temperature is between 10° C. and $T_{CP}$, the approximate temperature at which the constant power charging phase begins (States C & D) ($T_{CP}$ is just a reference on the chart—the transition to constant power is power dependent). The battery voltage must exceed approximately 5.6 V for the slow and maximum current charging phases to occur. During State E, a constant power charging phase commences with the battery cell temperature remaining fairly stable due to the controlled power output.

There are also two normal shutdown possibilities. When the battery temperature exceeds 42° C., a shutdown procedure (SD) executes, indicating either the charging process has completed, or perhaps a failure has occurred. When the temperature exceeds 50° C., a catastrophic failure may be imminent and a doomsday (DD) subroutine executes, immediately disabling the battery system completely and permanently.

The following is a list of the aforementioned breakpoints and associated parameters stored into the look-up table for the sample NiCd battery.

Charging States

State A—No charge, T<0° C. or T>42° C.→I=0.0—Enable charging when 0<T<42° C. and $V_{BATT}$>5.6V—

State B—Trickle charge, 0<T<10° C.→I=0.15 A

State C—Slow charge, $V_{BATT}$<10V, 10<T<42° C.→I=0.50 A

State D—MaxI charge, $V_{BATT}$>10V, 10<T<42° C., P<32 W→I=2.7 A

State E—MaxP charge, P=32 W

SD & DD—End charge, $V_{BATT}$>$V_2$=16.2V & ΔV<0.05V in 10 Sec (see code, DV=10000) or $V_{BATT}$>$V_3$=17.0V & T>42° C.

The following is a table of possible alarm values associated with the sample NiCd battery pack. The alarms are defined for two major events: shutdown and doomsday. Shutdown occurs anytime any single

|  | Shutdown (Column 1) | Doomsday (Column 2) |
| --- | --- | --- |
| Anytime | I > 2.75 | I > 3.0 |
|  | P > 35 W | P > 38 W |
|  | V < 5.4 V | V < 4.2 V |
|  | V > 18.7 V | V > 19.2 V |
|  | T > 42° C. | T > 50° C. |
|  | T < -03° C. | — | event of Column 1 occurs. For example, if the current exceeds 2.75 A, the shutdown routine will execute. Alternatively, if the temperature exceeds 42° C., the shutdown routine is executed. Similarly, if any event of Column 2 occurs, the doomsday routine will execute. The conditions for doomsday are always more extreme than those for shutdown. The shutdown routine will execute before the doomsday routine can execute. The first priority is to shutdown all operations in an orderly fashion (SD) before radical doomsday action needs to be taken (DD). Monitoring battery temperature is the primary measurement routinely checked. Additionally, control of the charging current is important in order to maintain charging characteristics within vendor specifications. Anytime the charging current deviates from programmed parameters, the system will react in some way. Therefore, if a system failure occurs, either the program is in error or the charge controller hardware failed. If the charge controller does not respond to a shutdown sequence, the doomsday routine executes to radically shutdown the system to prevent damage to the system or batteries.

Following is a sample listing of program code with respect to a sample NiCd battery pack.

```
;Set initial conditions - initialize V, I, P; disable
;SD (shutdown); disable DD (doomsday); and set alarm
;conditions for V, I, P, and T.
INIT        V=0                 ;Set all initial conditions
            I=0
            P=0
            S0
            F0
            AI>2.75, SD
            AI>3.00, DD
            AP>35, SD
            AP>38, DD
            AV<5.4, SD
            AV<4.2, DD
            AV>18.7, SD
            AV>19.2, DD
            AT>42.0, SD
            AT>50.0 DD
            AT<-3, SD
;First, check that minimum charging conditions are met,
;i.e. 0<T<42° C., and V_BATT>5.6 volts. If none of the
;minimum conditions are met, branch to INIT and set all
;conditions to a known state. If all conditions are
;met, move to STATB and commence a trickle charge of
;I=0.15 amps.
START       BT>42, INIT         ;Minimum charging conditions
            BT<0, INIT
            BV<5.6, INIT
;If the battery temperature exceeds 10° C., branch to
;STATC. Otherwise, loop to continue the trickle
;charge until T>10° C. However, if for some reason the
;voltage drops to <5.6 V, branch back to INIT to
;establish a proper charge state.
STATB       BT>10, STATC        ;Trickle charge routine
            I=0.15
            V=18.5
            P=32
            BV<5.6, INIT
            B STATB
;First, if we exceed normal operating temperature for
;this state, branch to INIT and initialize. Otherwise,
;if normal operating conditions exist, i.e. V_BATT<10
;volts and 10° C.<T<42° C., loop to continue a slow charge
;until the battery voltage exceeds 10 volts. When the
;battery voltage exceeds 10 V, branch to STATD and
;commence the normal (MaxI) charging phase.
STATC       BT>42, INIT         ;Slow charge
            BT<10, INIT
            BV>10, STATD
            I=0.5
            P=32
            V=18.5
            B STATC
;If normal operating conditions exist, i.e. V_BATT>10
;volts and 10° C.<T<42° C., loop to continue a maximum
```

```
;current charge (I=2.7 A) until the power exceeds 32
;watts. If P>32, branch to STATE and commence the
;constant power charging phase.
STATD       BT<10, INIT      ;MaxI charge state (P>32W)
            BV<10, INIT
            I=2.7
            V=18.5
            P>32, STATE
            B STATD
;If normal operating conditions exist, i.e. V_BATT>10
;volts and T>10° C., adjust current/voltage to attain
;constant 32 W charging, and loop until battery
;voltage reaches 16.2 V. If the V_BATT>16.2 V, branch
;to DV and run the voltage deviation routine to
;determine if the rate of voltage change indicates
;that the charging process can be shutdown. As a
;second check, if the V_BATT>17 V, branch to the
;temperature routine and check for process over-
;temperature. Otherwise, continue charging at a
;constant 32 watts.
STATE       BT<10, INIT      ;Constant power charge (P=32)
            BV<10, INIT
            BV>16.2, DV R
            BV>17.0, T1 R
            P=32
            B STATE
;If there is a deviation of 50 mV in battery voltage
;within a 10 second (10,000 msec) period of time,
;branch to the charging completion subroutine.
;Otherwise, return.
DV          BDV < 0.05, 10000, CHGCOMP
            B RTN
;If the temperature exceeds 40° C., branch to the
;charging completion subroutine. Otherwise, return.
T1          BT>40, CHGCOMP
            B RTN
;Enable shutdown (S1) and initialize all control
;signals for voltage, current, and power. Then end
;the process.
SD          S1               ;Set flag and power down
            I=0
            V=0
            P=0
            END
;Enable doomsday procedure by blowing a fuse. Compels
;immediate drop of current, voltage and power to the
;battery. Then initialize I, V, and P, and end the
;process.
DD          F1               ;Set flag and blow the fuse
            I=0
            V=0
            P=0
            END
;Charge completion routine. When the battery pack is at
;end-of-charge, set temperature flag for normal
;termination, initialize I, V, P, and end the process.
CHGCOMP     T1               ;End of charging process
            I=0
            V=0
            P=0
            END
;When executed, returns a signal to the main system for
;action or status.
            RTN
```

The program parameters can be changed through a I²C communications bus to the controller. In the code, SD represents a shutdown sequence and DD represents a doomsday sequence. The shutdown parameters S1/S0 represent the mode as enabled/disabled, respectively. Similarly, parameters F1/F0 represent enabling/disabling of the doomsday event, respectively. The doomsday event is a digital signal to execute the shutdown permanently, or to semi-permanently (resetable fuse) disable the discharge path from the battery.

Battery Management Architecture on the Battery Module

Figure 4:
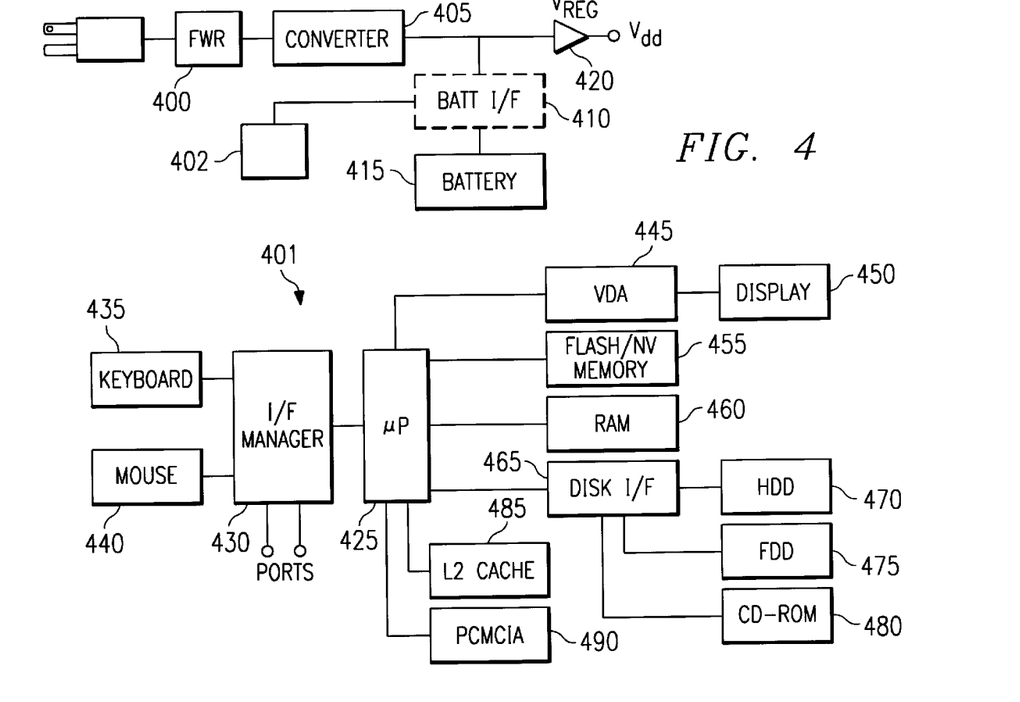
FIG. 4 shows a block diagram of a portable computer system with the innovative battery control architecture maintained on the battery pack module.

FIG. 4 shows a block diagram of a portable computer system with the innovative battery control architecture maintained on the battery pack module. The system comprises a power converter 405 which receives voltage from a full-wave bridge rectifier 400. The converter 405 feeds clean DC power both to a voltage regulator 420, which supplies regulated power to the main system 401, and to the battery cells 415. Optionally, a battery interface 410 is interposed between the battery cells 415 and the converter 405 to provide additional capabilities as may be required for different architectures. In this example, the innovative control circuitry 402 comprises the BCL program and may interface to the battery through the interface circuitry 410. In this configuration, when the user inserts a new battery technology into the portable computer, the system-side CPU 425 program may continue to execute code independently of the BCL code being run in the battery control architecture 402. With the management architecture contained only in the battery module, a vendor may offer the customer compatibility with any portable computer that accepts that particular battery module form factor (the battery module is backward compatible with all legacy computer systems in which it may be used). Alternatively, if the management architecture were employed on the host system in addition to the battery module, the host system may release the management function exclusively to the battery module controller to save host CPU cycles. The portable computer system comprises, in this example:

user input devices (e.g. keyboard 435 and mouse 440);

at least one microprocessor 425 which is operatively connected to receive inputs from said input device, through an interface manager chip 430 (which also provides an interface to the various ports);

a memory (e.g. flash or non-volatile memory 455 and RAM 460), which is accessible by the microprocessor;

a data output device (e.g. display 450 and video display adapter card 445) which is connected to output data generated by microprocessor; and a magnetic disk drive 470 which is read-write accessible, through an interface unit 465, by the microprocessor.

Optionally, of course, many other components can be included, and this configuration is not definitive by any means. For example, the portable computer may also include a CD-ROM drive 480 and floppy disk drive ("FDD") 475 which may interface to the disk interface controller 465. Additionally, L2 cache 485 may be added to speed data access from the disk drives to the microprocessor, and a PCMCIA 490 slot accommodates peripheral enhancements.

Battery Management Architecture on the Host System

Figure 6:
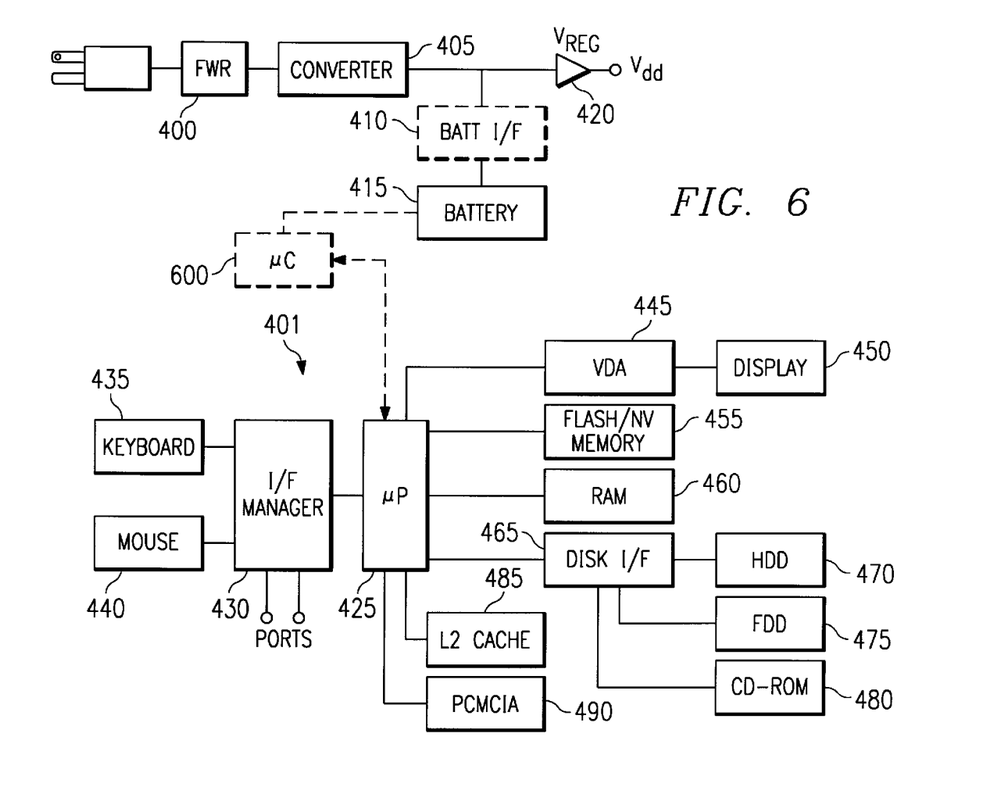
FIG. 6 shows a portable computer system with system-side control using the universal battery control language.

FIG. 6 shows a portable computer system with system-side 401 control using the universal battery control language. Optionally, a microcontroller 600 located, perhaps on the computer system motherboard, interfaces with the system CPU 425 for control of the battery. The microcontroller 600 runs the BCL program to properly control the battery cell charge/discharge characteristics. Alternatively, the BCL code may be executed by the system CPU 425 since the language is a high-level language easily transportable to any microprocessor technology. The program may, for example, be stored in BIOS (NVRAM) 455 where it may be executed upon computer startup. Alternatively, the control circuitry

600 may reside on a daughterboard inserted into a system 401 slot. In the configuration where the host system incorporates the battery management architecture, a vendor may offer backward compatibility with perhaps any legacy battery module, whether the module includes the innovative architecture, or not. The discussion of the remaining computer system components follows that of FIG. 4, above.

Alternative Embodiment: Data Table Independent of BCL Program

According to a disclosed class of innovative embodiments there may exist a table separate from the BCL program, which comprises parameters such as V, I, P, AV, AI, and AT.

Alternative Embodiment: Add-in Card System-side Battery Control

According to another disclosed class of innovative embodiments battery control may be designed into an add-in card inserted into a slot on the system-side of the computer.

Alternative Embodiment: System-side Battery Control

According to another disclosed class of innovative embodiments battery control may be provided only from the battery module.

Alternative Embodiment: External Charging System

According to another disclosed class of innovative embodiments the control architecture may be employed in stand-alone charging systems which are not a physical component of a larger system.

Thus the present application discloses, among other teachings, a method for controlling operation of a battery, comprising the actions of: (a.) providing for each new battery type, a customized control procedure in an application-specific high-level language; wherein said procedure specifies values for controlled variables, including voltage, current, temperature, and/or power, in dependence on measured variables which can include voltage, current, temperature, and/or power of the battery; and (b.) executing said procedure in programmable logic which is connected to at least partly controls charge transfer at the terminals of said battery; wherein said application-specific language operates said battery within predetermined limits to optimize the lifetime of said battery and to prevent damage to said battery and said system.

The present application also discloses, among other teachings, a method for controlling operation of a battery, comprising the actions of: (a.) providing, for each new battery type, a customized control procedure in an application-specific high-level language; wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and (b.) executing said procedure in programmable logic which is connected to at least partly control charge transfer at the terminals of said battery; wherein said application-specific language operates said battery within predetermined limits to optimize the lifetime of said battery and to prevent damage to said battery and said system.

The present application also discloses, among other teachings, a portable computer system, comprising: a user input device; a microprocessor operatively connected to detect inputs from said input device; memory which is connected to be read/write accessible by said microprocessor; a video controller connected to said microprocessor; a display operatively connected to display data generated by said video controller at a first refresh rate; and a power system connected to provide power to said microprocessor, said memory, and said display, and comprising: a battery subsystem comprising a battery and programmable logic; said programmable logic, under at least some circumstances, selectably executing a procedure in an application-specific high-level battery-control language; wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and whereby said programmable logic operates said battery optimally in accordance with said procedure.

The present application also discloses, among other teachings, a portable computer system, comprising: a user input device; a microprocessor operatively connected to detect inputs from said input device; memory which is connected to be read/write accessible by said microprocessor; a video controller connected to said microprocessor; a display operatively connected to display data generated by said video controller at a first refresh rate; and a power system connected to provide power to said microprocessor, said memory, and said display, and comprising: a battery subsystem comprising a battery and programmable logic; said programmable logic, under at least some circumstances, selectably executing a procedure in an application-specific high-level battery-control language; wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and whereby said programmable logic operates said battery optimally in accordance with said procedure.

The present application also discloses, among other teachings, a smart battery subsystem, comprising: a battery of electrochemical cells; and programmable logic and program storage; said programmable logic, under at least some circumstances, selectably executing, from said program storage, a battery control procedure in an application-specific high-level battery-control language; wherein said procedure at least partly controls charge transfer at the terminals of said battery, in dependence upon measured values of voltage, current, temperature, and/or power, using controlled variables which can include voltage, current, temperature, and/or power; wherein said application-specific language operates said battery optimally in accordance with said procedure; wherein said programmable logic and said battery cells are packaged together as a single integral unit.

The present application also discloses, among other teachings, a smart battery subsystem, comprising: a battery of electrochemical cells; and programmable logic and program storage; said programmable logic, under at least some circumstances, selectably executing, from said program storage, a battery control procedure in an application-specific high-level battery-control language; wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; wherein said programmable logic and said battery cells are packaged together as a single integral unit.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the battery temperature may be monitored not by only one sensor, but by two sensors, where the control program references the differential temperature of two points of the system.

For another example, the battery charging architecture may employ pulse width modulation ("PWM") techniques with PWM parameters coded into the management program. However, this technique may increase the size of the control language due to the increase in the number parameters required to properly implement this technique.

For another example, optionally, one may employ pulse charging techniques during the controlled charging process (reference U.S. patent application Ser. No. 08/885,049), and BCL can be modified accordingly—commands can be renamed or formatted differently, other commands can be added, and other functional relationships added (e.g. parallelism).

What is claimed is:

1. A method for controlling operation of a battery, comprising the actions of:
   (a.) providing for each new battery type, a customized control procedure in an application-specific high-level language; wherein said procedure specifies values for controlled variables, including voltage, current, temperature, and/or power, in dependence on measured variables which can include voltage, current, temperature, and/or power of the battery; and
   (b.) executing said procedure in programmable logic which is connected to at least partly controls charge transfer at the terminals of said battery; wherein said application-specific language operates said battery within predetermined limits to optimize the lifetime of said battery and to prevent damage to said battery and said system.

2. The method of claim 1, wherein said programmable logic is packaged integrally with said battery in a removable module.

3. The method of claim 1, wherein said procedure, in said high-level language, is hardware-independent.

4. The method of claim 1, wherein said procedure conditionally executes a shutdown routine when the temperature of said battery reaches a predetermined limit, and abnormally terminates operation of said battery.

5. The method of claim 1, wherein said procedure conditionally executes a doomsday routine which permanently and irrevocably disconnects said battery when said temperature of said battery reaches a predetermined limit.

6. The method of claim 1, wherein said procedure can be executed in an architecture of said computer which is external to said battery subsystem.

7. A method for controlling operation of a battery, comprising the actions of:
   (a.) providing, for each new battery type, a customized control procedure in an application-specific high-level language;
       wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and
   (b.) executing said procedure in programmable logic which is connected to at least partly control charge transfer at the terminals of said battery; wherein said application-specific language operates said battery within predetermined limits to optimize the lifetime of said battery and to prevent damage to said battery and said system.

8. The method of claim 7, wherein said programmable logic is packaged integrally with said battery in a removable module.

9. The method of claim 7, wherein said procedure, in said high-level language, is hardware-independent.

10. The method of claim 7, wherein said procedure conditionally executes a shutdown routine when the temperature of said battery reaches a predetermined limit, and terminates operation of said battery.

11. The method of claim 7, wherein said procedure conditionally executes a doomsday routine which permanently and irrevocably disconnects said battery when said temperature of said battery reaches a predetermined limit.

12. The method of claim 7, wherein said procedure can be executed in an architecture of said computer which is external to said battery subsystem.

13. A portable computer system, comprising:
    a user input device;
    a microprocessor operatively connected to detect inputs from said input device;
    memory which is connected to be read/write accessible by said microprocessor;
    a video controller connected to said microprocessor;
    a display operatively connected to display data generated by said video controller at a first refresh rate; and
    a power system connected to provide power to said microprocessor, said memory, and said display, and comprising:
      a battery subsystem comprising a battery and programmable logic; said programmable logic, under at least some circumstances, selectably executing a procedure in an application-specific high-level battery-control language;
      wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and
    whereby said programmable logic operates said battery optimally in accordance with said procedure.

14. The system of claim 13, wherein said programmable logic is packaged integrally with said battery in a removable module.

15. The system of claim 13, wherein said procedure, in said high-level language, is hardware-independent.

16. The system of claim 13, wherein said procedure conditionally executes a shutdown routine when the temperature of said battery reaches a predetermined limit, and terminates operation of said battery.

17. The system of claim 13, wherein said procedure executes a doomsday routine which permanently and irrevocably disconnects said battery when said temperature of said battery reaches a predetermined limit.

18. The system of claim 13, wherein said procedure can be executed in an architecture of said computer which is external to said battery subsystem.

19. A portable computer system, comprising:
- a user input device;
- a microprocessor operatively connected to detect inputs from said input device;
- memory which is connected to be read/write accessible by said microprocessor;
- a video controller connected to said microprocessor;
- a display operatively connected to display data generated by said video controller at a first refresh rate; and
- a power system connected to provide power to said microprocessor, said memory, and said display, and comprising:
  - a battery subsystem comprising a battery and programmable logic; said programmable logic, under at least some circumstances, selectably executing a procedure in an application-specific high-level battery-control language;
  - wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables; and
- whereby said programmable logic operates said battery optimally in accordance with said procedure.

20. The system of claim 19, wherein said procedure, in said high-level language, is hardware-independent.

21. The system of claim 19, wherein said procedure conditionally executes a shutdown routine when the temperature of said battery reaches a predetermined limit, and terminates operation of said battery.

22. The system of claim 19, wherein said procedure conditionally executes a doomsday routine which permanently and irrevocably disconnects said battery when said temperature of said battery reaches a predetermined limit.

23. The system of claim 19, wherein said procedure can be executed in an architecture of said computer which is external to said battery subsystem.

24. The system of claim 19, wherein said programmable logic is packaged integrally with said battery in a removable module.

25. A smart battery subsystem, comprising:
- a battery of electrochemical cells; and
- programmable logic and program storage; said programmable logic, under at least some circumstances, selectably executing, from said program storage, a battery control procedure in an application-specific high-level battery-control language; wherein said procedure at least partly controls charge transfer at the terminals of said battery, in dependence upon measured values of voltage, current, temperature, and/or power, using controlled variables which can include voltage, current, temperature, and/or power; wherein said application-specific language operates said battery optimally in accordance with said procedure;
- wherein said programmable logic and said battery cells are packaged together as a single integral unit.

26. The subsystem of claim 25, wherein said procedure, in said high-level language, is hardware-independent.

27. The subsystem of claim 25, wherein said procedure conditionally executes a shutdown routine when the temperature of said battery reaches a predetermined limit, and terminates operation of said battery.

28. The subsystem of claim 25, wherein said procedure conditionally executes a doomsday routine which permanently and irrevocably disconnects said battery when said temperature of said battery reaches a predetermined limit.

29. The subsystem of claim 25, wherein said procedure can be executed in an architecture of said computer which is external to said battery subsystem.

30. A smart battery subsystem, comprising:
- a battery of electrochemical cells; and
- programmable logic and program storage; said programmable logic, under at least some circumstances, selectably executing, from said program storage, a battery control procedure in an application-specific high-level battery-control language;
- wherein said procedure includes multiple states, and commands control sequence in each said state, until a specified condition for transition to another state is met; respective ones of said control sequences respectively specifying voltage, current, temperature, and/or power as controlled variables, and using voltage, current, temperature, and/or power as measured variables;
- wherein said programmable logic and said battery cells are packaged together as a single integral unit.

31. The subsystem of claim 30, wherein said procedure, in said high-level language, is hardware-independent.

32. The subsystem of claim 30, wherein said procedure conditionally executes a shutdown routine when the temperature of said battery reaches a predetermined limit, and terminates operation of said battery.

33. The subsystem of claim 30, wherein said procedure conditionally executes a doomsday routine which permanently and irrevocably disconnects said battery when said temperature of said battery reaches a predetermined limit.

34. The subsystem of claim 30, wherein said procedure can be executed in an architecture of said computer which is external to said battery subsystem.

* * * * *